(12) United States Patent
Tsuji

(10) Patent No.: US 7,399,997 B2
(45) Date of Patent: Jul. 15, 2008

(54) SEMICONDUCTOR LASER DEVICE AND FABRICATION METHOD THEREOF

(75) Inventor: Makoto Tsuji, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/637,014

(22) Filed: Dec. 12, 2006

(65) Prior Publication Data

US 2007/0096138 A1    May 3, 2007

Related U.S. Application Data

(62) Division of application No. 10/845,242, filed on May 14, 2004, now Pat. No. 7,170,102.

(30) Foreign Application Priority Data

May 29, 2003    (JP) .............................. 2003-151941

(51) Int. Cl.
*H01L 31/0232*    (2006.01)
*H01L 31/0203*    (2006.01)

(52) U.S. Cl. .............................. 257/99; 438/48; 438/65; 438/64; 438/54; 438/59; 372/43; 372/36; 257/432; 257/433; 257/434

(58) Field of Classification Search .................. 438/48, 438/65, 64, 54, 59; 372/43, 36; 257/432, 257/433, 434
See application file for complete search history.

(56) References Cited

U.S. PATENT DOCUMENTS 4,338,577 A * 7/1982 Sato et al. ..................... 372/36
7,170,102 B2   1/2007 Tsuji

FOREIGN PATENT DOCUMENTS

| JP | 6-291418 | 10/1994 |
|---|---|---|
| JP | 7-142813 | 6/1995 |

OTHER PUBLICATIONS

U.S. Appl. No. 10/845,242, filed May 14, 2004.

* cited by examiner

*Primary Examiner*—Jerome Jackson
*Assistant Examiner*—Joseph Nguyen
(74) *Attorney, Agent, or Firm*—Nixon & Vanderhye P.C.

(57) ABSTRACT

A semiconductor laser device aimed to be reduced in size and that can maintain high position accuracy, and a fabrication method of such a semiconductor laser device are achieved. A semiconductor laser device includes a stem as a base member, and a cap member. The stem includes a main unit having a reference plane, and a heat sink platform as an element mount unit, located on the reference plane for mounting a laser element. The cap member is set on the reference plane of the stem so as to cover the heat sink platform. A hole is formed at the sidewall of the cap member facing the heat sink platform. Fixation between the cap member and the stem is established by fixedly attaching the portion at the inner side of the sidewall of the cap member adjacent the hole to the outer circumferential plane of a heat sink platform.

1 Claim, 8 Drawing Sheets

SEMICONDUCTOR LASER DEVICE AND FABRICATION METHOD THEREOF

This application is a Divisional of application Ser. No. 10/845,242 filed May 14, 2004 now U.S. Pat No. 7,170,102, which claims priority on JP 2003-151941 filed May 29, 2003, the entire contents of which are hereby incorporated herein by reference in this application.

BACKGROUND OF THE INVENTION

1. Field of the Invention

The present invention relates to a semiconductor laser device and a fabrication method of this semiconductor laser device. More particularly, the present invention relates to a semiconductor laser device that can be reduced in size and that has high reliability, and a fabrication method of such a semiconductor laser device.

2. Description of the Background Art

Conventional semiconductor laser devices employed in optical disk drive apparatuses and the like are known. For example, the semiconductor laser device disclosed in Japanese Patent Laying-Open No. 7-142813 has a cap member connected and fixed to a base member where a laser element is set, so as to cover the laser element.

The demand for a compact optical disk drive apparatus also places the demand for the semiconductor laser device to be reduced in size.

When a semiconductor laser device is incorporated into an optical disk drive apparatus, the position of the semiconductor laser device must be determined at high accuracy. Positioning of the semiconductor laser device is conducted using, as a reference plane, the area located outside the cap member at the plane of the base member to which the cap member is connected. The area of the region that can be used for the reference plane has become smaller in accordance with the reduction in size of the semiconductor laser device. It has therefore become difficult to maintain the high position accuracy of the semiconductor laser device in the assembly work of a semiconductor laser device into an optical disk drive apparatus.

SUMMARY OF THE INVENTION

An object of the present invention is to provide a semiconductor laser device that can be reduced in size and that allows the position accuracy to be maintained at a high level, and a fabrication method of such a semiconductor laser device.

According to an aspect of the present invention, a semiconductor laser device includes a base member and a cap member. The base member includes a main unit having a reference plane, and an element mount unit located on the reference plane of the main unit for mounting a laser element. The cap member is set on the reference plane of the base member so as to cover the element mount unit. The cap member is formed with a hole at a sidewall facing the element mount unit. By fixedly attaching a region adjacent the hole at the inner circumference of the sidewall of the cap member to the outer circumferential plane of the element mount unit, the cap member and the base member are secured.

Fixation between the cap member and the base member can be established by fixedly attaching the portion where a hole is formed in the sidewall of the cap member to the outer circumferential plane of the element mount unit in the base member. It is therefore not necessary to establish connecting fixation between the reference plane of the base member and the rim plane of the cap member that forms contact with the reference plane. Therefore, formation of a projection (flange) at the rim plane of the cap member for fixture is dispensable. Sufficient area of the reference plane of the base member located at the outer side of the rim plane of the cap member can be ensured, when aiming to reduce the size of the semiconductor laser device. As a result, positioning of the semiconductor laser can be conducted taking advantage of the region located at the outer side of the rim plane of the cap member at the reference plane of the base member when the semiconductor laser is reduced in size.

In the above-described semiconductor laser device, at least two (a plurality of) holes can be formed at the sidewall of the cap member. The two or more holes can be formed at equal intervals with respect to each other about the center axis of the cap member along the direction in which the cap member is attached to the base member.

In this case, positioning between one of the plurality of holes formed at the sidewall of the cap member and the outer circumferential plane of the element mount member of the base member can be facilitated.

When the open angle formed by respective end points of the outer circumferential plane of the element mount unit of the base member about the center point of the reference plane of the base member is 180° (i.e., straight angle), at least one of the plurality of holes will always be arranged facing the outer circumferential plane of the element mount unit by setting the cap member so as to cover the element mount unit. Therefore, connection between the cap member and the element mount unit of the base member can be conducted without having to pay critical attention to the angle of rotation of the cap member with respect to the center axis of the cap member.

In the semiconductor laser device of the present aspect, the cap member may have a cylindrical configuration. The cap member can be set on the reference plane of the base member such that the direction of the center axis along the extending direction of the cap member (or the center axis of the cap member along the direction of attaching the cap member to the base member) is approximately parallel to a direction substantially perpendicular to the reference plane of the main unit in the base member.

By rotating the cylindrical cap member about the center axis thereof, the hole at the sidewall of the cap member can be readily arranged at a position facing the outer circumferential plane of the element mount unit of the base member.

When n holes are formed at the sidewall of the cap member in the semiconductor laser device of the present aspect, the open angle formed by respective end points in the direction along the reference plane with respect to the center point of the reference plane of the main unit at the outer circumferential plane of the element mount unit facing the sidewall of the cap member may be at least 360°/n.

Accordingly, at least one of the n holes will always face the outer circumferential plane of the element mount unit when the cap member is set so as to cover the element mount unit. Therefore, the cap member can be attached to the base member without having to pay critical attention to the angle of rotation of the cap member about the center axis.

Since at least one of the holes is always arranged at a position facing the outer circumferential plane of the element mount unit (located overlapping with the outer circumferential plane), connecting fixation can be readily established between the outer circumferential plane of the element mount unit and the wall region in the proximity of the hole formed at the cap member (for example, fixation can be readily established through laser welding).

In the above-described semiconductor laser device, the number of holes n formed at the sidewall of the cap member may be 2, and the open angle of the element mount unit may be substantially 180°.

Since the number of holes formed at the cap member is few, production of the cap member is facilitated. Furthermore, when the cap member is placed over the element mount unit, the hole of the cap member can be made to face the outer circumferential plane of the element mount unit.

In the above-described semiconductor laser device, the number of holes n formed at the sidewall of the cap member may be 6, and the open angle of the element mount unit may be substantially 60°. Furthermore, the open angle of the element mount unit may be 60° or more.

By setting the open angle of the element mount unit to approximately 60°, a structure of the base member (for example, a conductor such as a lead pin electrically connected to the laser element) can be readily arranged beside the laser element mounted on the element mount unit. The 6 holes formed at the cap member are preferably located at equal intervals with respect to each other about the center axis of the cap member. When the cap member is set on the element mount unit, the hole of the cap member can be arranged reliably at a position facing the outer circumferential plane of the element mount unit. Therefore, the cap member and the element mount unit can be readily fixed by laser welding and the like through the hole portion.

In the above-described laser device, fixation between the cap member and the base member may be establish by fixedly attaching the portion adjacent the hole at the inner circumferential side of the sidewall of the cap member to the outer circumferential plane of the element mount unit through laser welding.

By directing a laser beam to a region of the cap member corresponding to the hole, the cap member can be easily welded and secured with the element mount unit even in the case where the sidewall of the cap member is in plane-contact with the outer circumferential plane of the element mount unit.

In the above-described semiconductor laser device, the joint between the rim plane of the cap member facing the reference plane and the reference plane of the main unit may be fixedly attached by resistance welding.

This ensures connecting-fixation between the cap member and the base member.

A fabrication method of the semiconductor laser device of the present invention includes the steps of preparing a base member, preparing a cap member, and laser welding the contacting portion between the cap member and the element mount unit. At the step of preparing a base member, a base member including a main unit having a reference plane, and an element mount unit located on the reference plane of the main unit for mounting a laser element, are prepared. At the step of preparing a cap member, a cap member that can cover the element mount unit, and having a hole formed at a sidewall facing the outer circumferential plane of the element mount unit, is prepared. At the step of welding the contacting portion, the contacting portion is laser-welded by directing a laser beam to the contacting portion between the cap member and the element mount through the hole under the state where the cap member is set so as to cover the element mount unit on the reference plane of the base member, and such that the inner circumferential plane of the sidewall where the hole is formed is brought into contact with the outer circumferential plane of the element mount unit.

Accordingly, a semiconductor laser device of the present invention can be fabricated easily.

In a fabrication method of a semiconductor laser device of the present invention, the semiconductor laser device includes a base member and a cap member. The base member includes a main unit having a reference plane, and an element mount unit located on the reference plane of the main unit for mounting a laser element. The cap member is set on the reference plane of the base member so as to cover the element mount unit. A hole is formed at the sidewall of the cap member facing the element mount unit. The cap member and the base member are fixed by fixedly attaching the portion adjacent the hole at the inner circumferential side of the sidewall of the cap member to the outer circumferential plane of the element mount unit. The fabrication method of this semiconductor laser includes the steps of preparing material for the cap member, forming a hole in the material, and shaping the cap member by press-working the material formed with the hole.

Thus, a cap member constituting a semiconductor laser device can be obtained easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
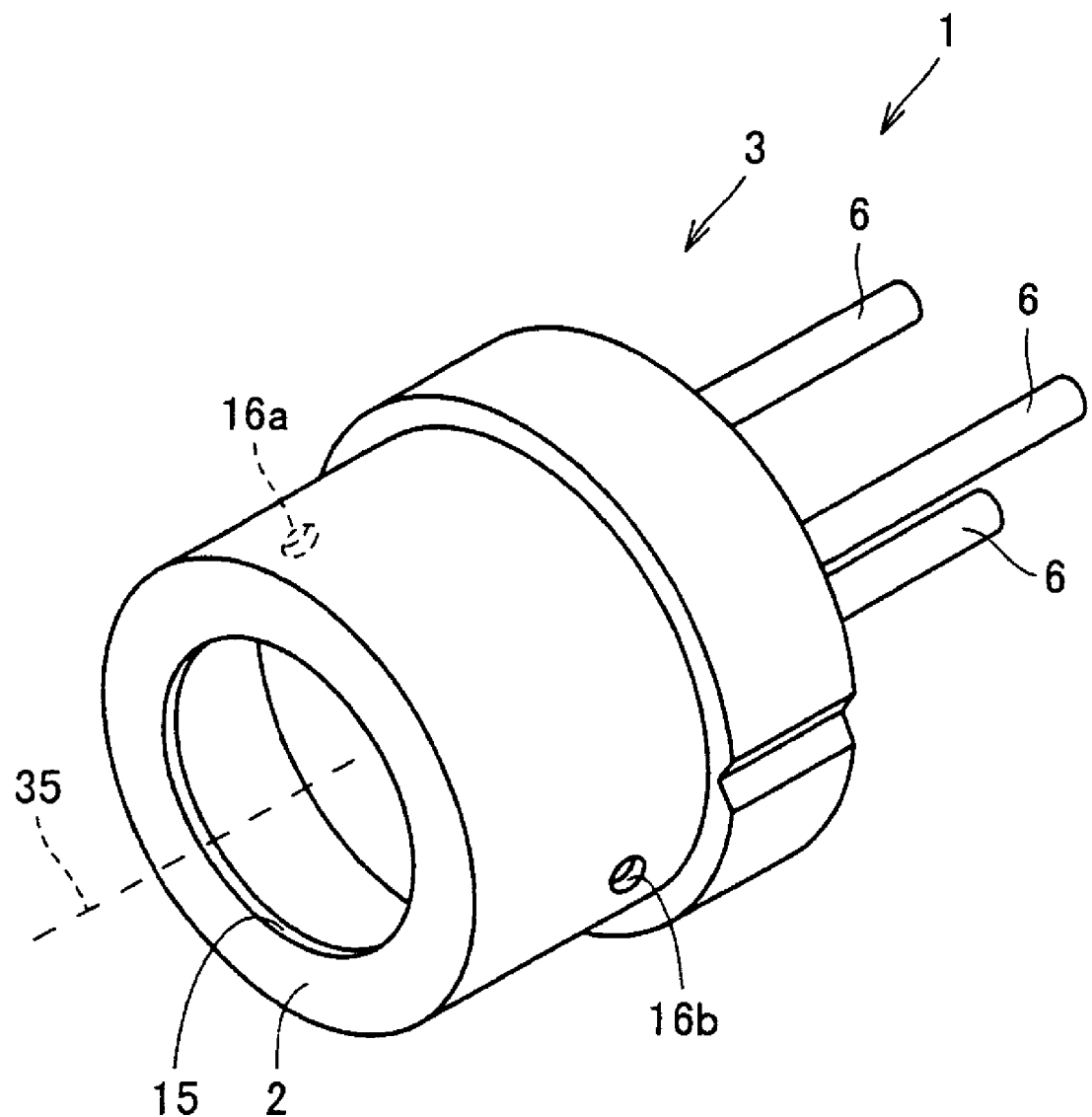
FIG. 1 is a perspective schematic view of a semiconductor laser device according to a first embodiment of the present invention.

Embodiments of the present invention will be described hereinafter with reference to the drawings. In the drawings, the same or corresponding elements have the same reference characters allotted, and description thereof will not be repeated.

First Embodiment

A semiconductor laser device according to a first embodiment of the present invention will be described hereinafter with reference to FIGS. 1 and 2.

Figure 2:
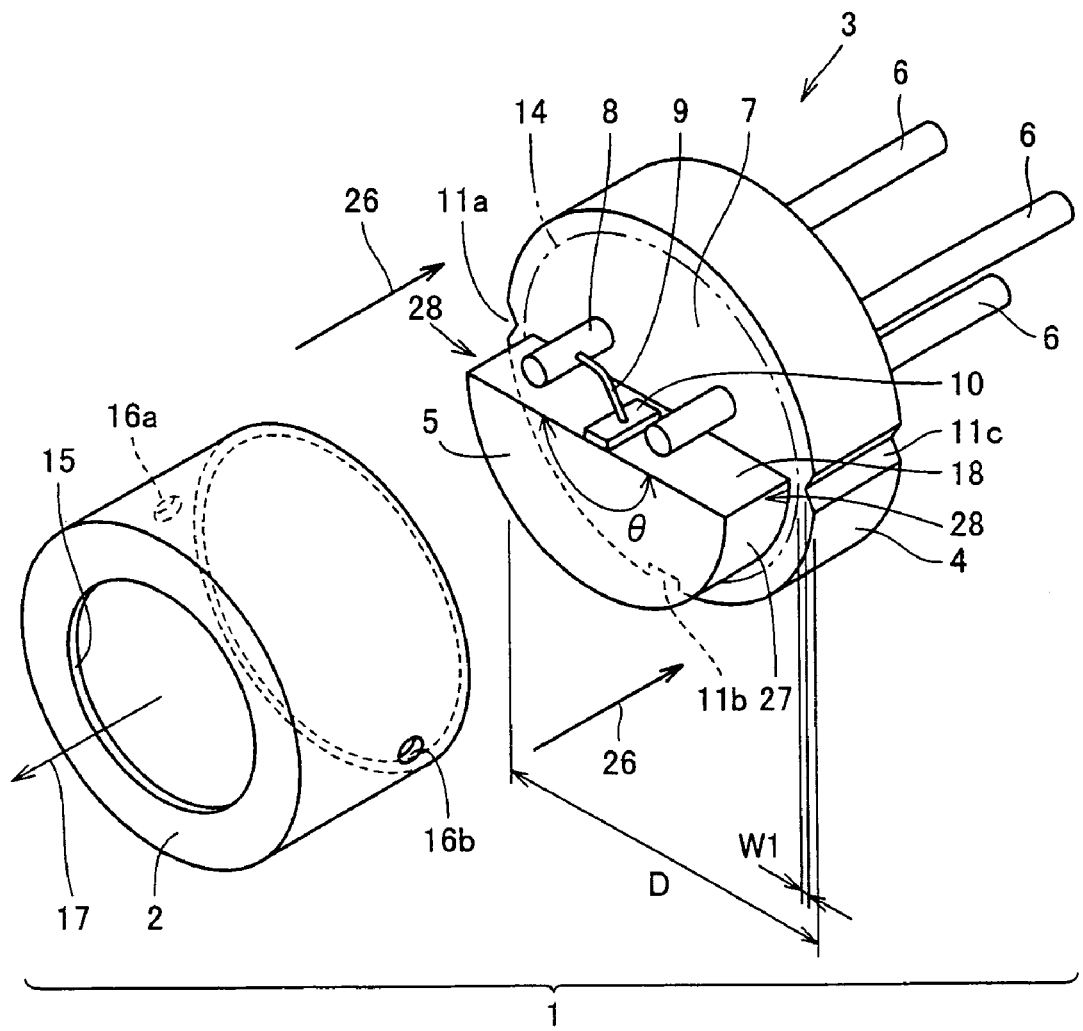
FIG. 2 is an exploded schematic view of the semiconductor laser device of FIG. 1.

Referring to FIGS. 1 and 2, a semiconductor laser device 1 includes a stem 3 identified as a base member, a laser element 10 set at a heat sink platform 5 attached to a reference plane 7 of stem 3, and a cap member 2 arranged so as to surround heat sink platform 5 identified as an element mount unit and laser element 10. A main unit 4 having reference plane 7 and heat sink platform 5 constitute stem 3. Three leads 6 are provided at main unit 4 of stem 3. Specifically, two leads 6 pass through main unit 4 from the side of reference plane 7 to the back side located opposite to reference plane 7. The third lead is provided at the back side of main unit 4. This third lead 6 is electrically connected to reference plane 7 of main unit 4. At the sidewall of main unit 4 of stem 3, positioning grooves 11a-11c are formed. Reference plane 7 is circular in plane.

Heat sink platform 5 set on reference plane 7 of main unit 4 has an open angle θ of 180°. In other words, an element setting plane 18 on which laser element 10 is mounted at heat sink platform 5 is substantially a flat plane, and heat sink platform 5 has a semi-circle shape when viewed from the cap member 2 side. Laser element 10 mounted on element setting plane 18 of heat sink platform 5 is electrically connected to a lead end 8 through a tie line 9. Tie line 9 is formed of a conductor such as gold.

Reference plane 7 of stem 3 has an outer diameter D of, for example, 3.3 mm. The distance W1 between outermost edge 14 of cap member 2, when disposed on reference plane 7 of stem 3, and the bottom of positioning groove 11c is, for example, 0.1 mm. It is to be noted that some distance is required between the outermost edge of cap member 2, when disposed on reference plane 7 of stem 3, and positioning groove 11c (i.e., distance W1 between outermost edge 14 of the cap member and the bottom of positioning groove 11c). This is because reference plane 7 will serve as a reference plane for the positioning of the laser device in the assembly procedure of semiconductor laser device 1 with the optical disk pickup apparatus.

The region set forth above (the external marginal region of reference plane 7 located between outermost edge 14 of the cap member and the bottom of positioning groove 11c) is required also in adjusting the position of rotation of semiconductor laser device 1. Therefore, distance W1 is preferably set to approximately 0.3 mm. This distance W1 is substantially equal to the distance W1 of a semiconductor laser device having a reference plane 7 of stem 3 with a diameter D of approximately 5.6 mm. Accordingly, the area of the region (the aforementioned external marginal region) serving as the reference plane for positioning a semiconductor laser device can be increased even if the semiconductor laser device has a relatively small diameter D. Thus, adjustment of the rotating position of semiconductor laser device 1 in the assembly procedure of semiconductor laser device 1 into an optical disk pickup can be carried out readily, as in the case of a conventional semiconductor laser having a diameter of approximately 5.6 mm.

If there is approximately 0.3 mm for the distance (margin) W1 between the outermost edge of cap member 2 and the bottom of positioning groove 11c when cap member 2 is to be attached to stem 3, stem 3 and cap member 2 can be connected with a positioning accuracy similar to that of a conventional semiconductor laser device having a diameter of approximately 5.6 mm. Thus, the connection between stem 3 and cap member 2 can be established readily even if there is some variation in the dimension of cap member 2 and stem 3.

A laser beam output hole 15 is formed at the bottom plane of cap member 2 (the plane opposite to the rim plane of cap member 2). Further, holes 16a and 16b are formed at the sidewall of cap member 2. Holes 16a and 16b are formed substantially at equal intervals with respect to each other about the center axis (cylindrical axis) of cap member 2.

To summarize the characteristic feature of the semiconductor laser device of the present invention, semiconductor laser device 1 includes a stem 3 identified as a base member, and a cap member 2. Stem 3 includes a main unit 4 having a reference plane 7, and a heat sink platform 5 identified as an element mount unit, located on the reference plane of main unit 4 for mounting a laser element 10. Cap member 2 is set on reference plane 7 of stem 3 so as to cover heat sink platform 5. In cap member 2, a hole 16b is formed at the sidewall facing heat sink platform 5. The portion at the inner circumferential side of the sidewall of cap member 2 adjacent hole 16b is fixedly attached to outer circumferential plane 27 of heat sink platform 5, whereby fixation between cap member 2 and stem 3 is established.

By fixedly attaching the portion of cap member 2 adjacent hole 16b at the sidewall to the outer circumferential plane 27 of heat sink platform 5 of stem 3, fixation between cap member 2 and stem 3 is established. Therefore, it is not necessary to establish connecting fixation between reference plane 7 of stem 7 and the rim plane of cap member 2 in contact with reference plane 7 through resistance welding or the like. This eliminates the need to form a projection (flange) at the rim plane of cap member 2 for connecting fixation. Sufficient area of reference plane 7 of stem 3 located at the outer side of the rim of cap member 2 can be ensured in the case where semiconductor laser device 1 is to be reduced in size. As a result, semiconductor laser device 1 can be positioned taking advantage of the region of reference plane 7 in stem 3 located outer than the rim of cap member 2 when semiconductor laser 1 is reduced in size.

In semiconductor laser device 1, two holes 16a and 16b are formed at the sidewall of cap member 2. However, two or more holes may be formed. The two or more holes may be formed at equal intervals with respect to each other when viewed from the center axis (cylindrical axis) of cap member 2 along the direction of attaching cap member 2 to stem 3 (the direction indicated by arrow 26 in FIG. 2).

This provides the advantage that one of the holes formed at the sidewall of cap member 2 can be readily positioned with respect to outer circumferential plane 27 of heat sink platform 5 of stem 3.

When the angle (open angle θ) formed by respective end points (i.e., line segment 28 when projected on reference plane 7) on outer circumferential plane 27 in heat sink platform 5 of stem 3 about the center of reference plane 7 of stem 3 is 180° as shown in FIG. 2, setting cap member 2 so as to cover heat sink platform 5 will cause at least one of the plurality of holes (in FIG. 2, hole 16b of two holes 16a and 16b) to be positioned facing outer circumferential plane 27 of heat sink platform 5. Therefore, connection between cap member 2 and heat sink platform 5 of stem 3 can be carried out without having to pay critical attention to the angle of rotation of cap member 2 with respect to the center axis of cap member 2.

Even in the case where laser beam output hole 15 is occluded as a result of attaching an optical element on cap member 2 by an adhesive or the like, the formation of holes 16a and 16b at the sidewall of cap member 2 allows water vapor and the like introduced inside cap member 2 through the adhesive to be discharged outside cap member 2 from one of holes 16a and 16b (the hole not blocked by outer circumferential plane 27 of heat sink platform 5). Therefore, the possibility of the transmittance of the optical element being degraded due to condensation occurring inside cap member 2 by the aforementioned water vapor can be reduced. Further, the possibility of shorting during current application at laser element 10 due to condensation can be reduced.

The number of holes formed at the sidewall of cap member 2 may be one. It is to be noted that, if that one hole is located facing outer circumferential plane 27 of heat sink platform 5, the hole at the sidewall of cap member 2 will be occluded by the outer circumferential plane of heat sink platform 5 in the case where the inner circumferential plane of the sidewall of cap member 2 is in contact with outer circumferential plane 27 of heat sink platform 5. In this state of affairs, it will become difficult to discharge the water vapor in cap member 2 outside through the hole.

It is therefore preferable to prevent the hole, when only one is formed, from being completely blocked by heat sink platform 5. (For example, measures can be taken such as increasing the size of the hole so that only a portion of the hole in cap member 2 will overlap with outer circumferential plane 27 of heat sink platform 5.) However, directivity of rotation of cap member 2 will be imposed.

In view of the circumstances set forth above, it is preferable to form two holes 16a and 16b as shown in FIGS. 1 and 2, or three or more holes (a plurality of holes), at equal intervals with respect to each other about the center axis (cylindrical axis) of cap member 2. Even if one of the plurality of holes (for example hole 16b) is blocked by outer circumferential plane 27 of heat sink platform 5 (for example, in the case where the sidewall portion of cap member 2 in the proximity of hole 16b is fixedly attached to outer circumferential plane 27 through laser welding and the like, as will be described afterwards), another hole (for example, hole 16a) will always be located at a position not blocked by heat sink platform 5. Accordingly, the water vapor inside cap member 2 can be readily emitted outside cap member 2 through hole 16a. In other words, the operation of fixedly attaching cap member 2 to stem 3 can be conducted readily without reducing the effect of discharging water vapor and the like in cap member 2 outside and without having to take into account the directivity of the cap member.

In semiconductor laser device of the present embodiment, fixation between cap member 2 and stem 3 can be established by fixedly attaching the portion adjacent to hole 16b at the inner circumferential side of the sidewall of cap member 2 to outer circumferential plane 27 of heat sink platform 5 through laser welding. Even under the state where the sidewall of cap member 2 is in plane-contact with outer circumferential plane 27 of heat sink platform 5, cap member 2 can be readily welded to heat sink platform 5 at the junctional region between the inner wall portion of cap member 2 at hole 16b and outer circumferential plane 27 of heat sink platform 5 by directing a laser beam to the junctional region through hole 16b.

A fabrication method of the semiconductor laser device of FIGS. 1 and 2 will be described hereinafter with reference to FIGS. 3-9.

Figure 3:
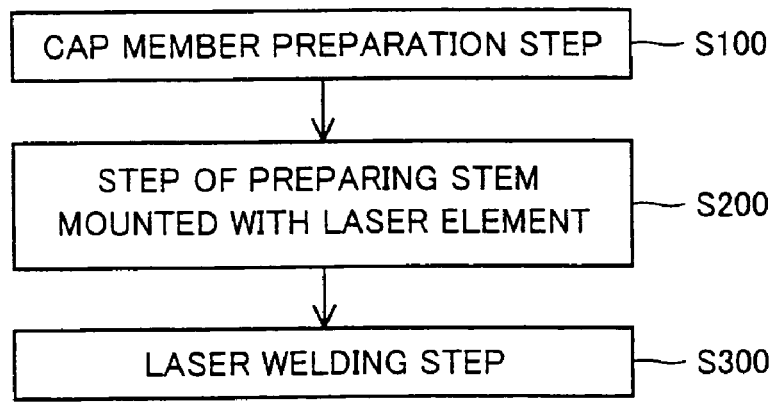
FIG. 3 is a flow chart to describe a fabrication method of the semiconductor laser device of FIG. 1.

As shown in FIG. 3, the fabrication method of the semiconductor laser device of FIG. 1 includes a cap member preparation step (S100), a step of preparing a stem on which a semiconductor laser element is mounted (S200), and a laser welding step (S300). At the cap member preparation step (S100), first a material preparation step (S110) is conducted, as shown in FIG. 4.

Figure 5:
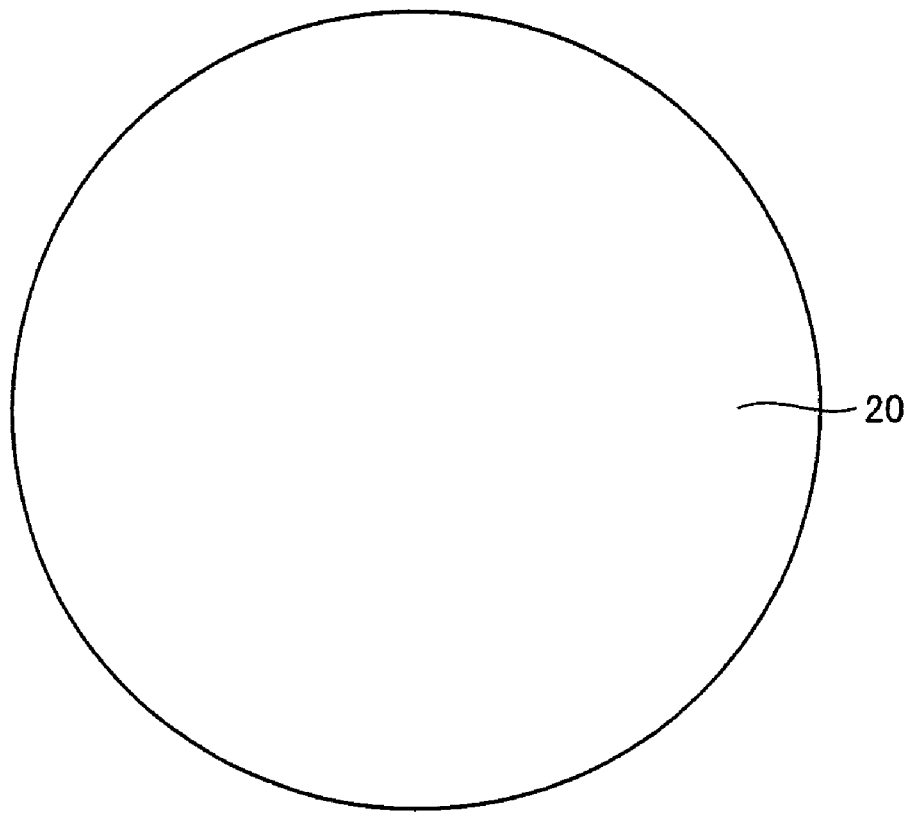
FIG. 5 is a schematic diagram to describe the material preparation step of FIG. 4.

At this material preparation step (S110), material 20 corresponding to cap member 2 (refer to FIG. 1) is prepared, as shown in FIG. 5. Material 20 has its configuration shaped so as to conform to the shape of cap member 2 that is to be produced. Here, material 2 is a sheet-like material having a disk shape in plane.

Figure 4:
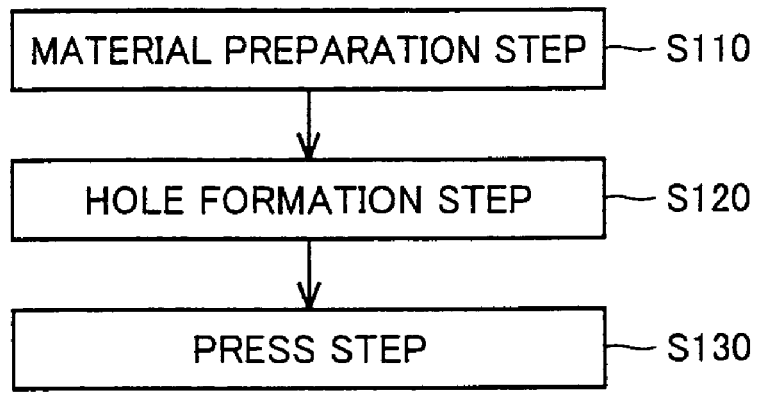
FIG. 4 is a flow chart to describe the cap member preparation step of FIG. 3.

At cap member preparation step (S100) (refer to FIG. 3), the step of forming a hole (S120) is conducted, as shown in FIG. 4. At this step of forming a hole (S120), a laser beam output hole 15 of cap member 2 (refer to FIG. 2) as well as holes 16a and 16b corresponding to respective formations at the sidewall of cap member 2 are formed in member 20. Holes 15, 16a and 16b are formed by, for example, punching through respective portions corresponding to holes 15, 16a and 16b from material 20 using a die and a punch.

Figure 6:
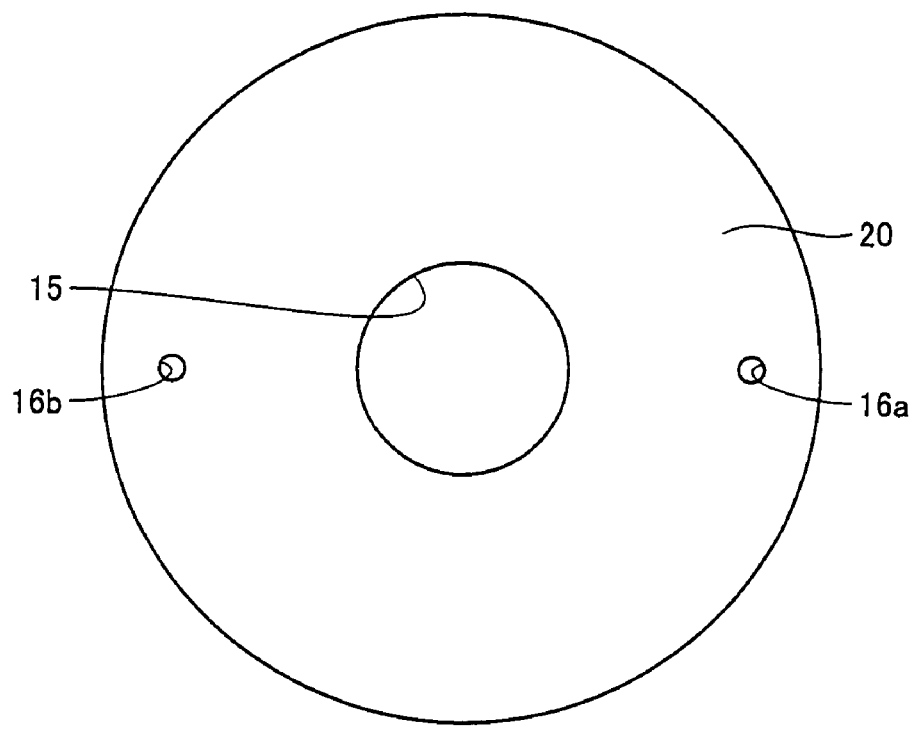
FIG. 6 is a schematic diagram to describe the step of forming a hole of FIG. 4.
Figure 8:
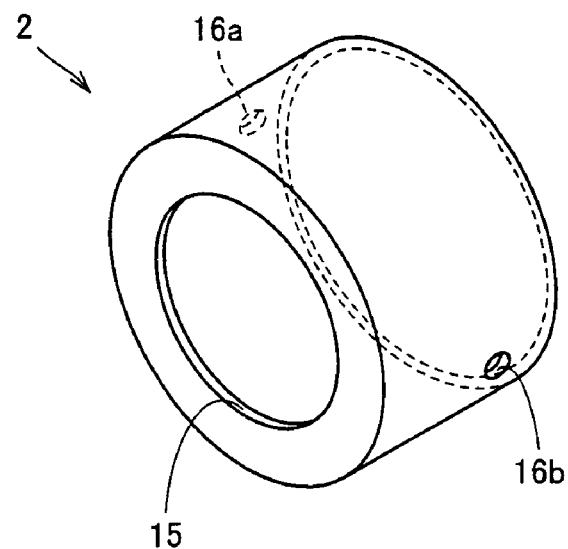
FIG. 8 is a perspective schematic view of a cap member obtained by the cap member preparation step of FIG. 3.

At the cap member preparation step (S100) (refer to FIG. 3), a press step (S130) is carried out. At the press step (S130), material 20 shown in FIG. 6 is disposed between a die 21 formed with a concave 23 that is circular in plane and a punch 22 sized to be inserted into concave 23. By moving punch 22 relatively towards die 21 in the direction indicated by arrow 24, material 20 is deformed to take a configuration conforming to concave 23 of die 21 (i.e. the shape of a cup). Then, punch 22 is moved in a direction opposite to the direction of arrow 24 away from die 21, whereby punch 22 is withdrawn from concave 23. By such a step, cap member 2 as shown in FIG. 8 can be obtained. Thus, the cap member preparation step (S100) (refer to FIG. 3) is conducted. Following this press step (S130), an additional step of processing the rim plane of cap member 2 that will be brought into contact with stem 3 may be carried out to ensure the flatness of the rim plane of cap member 2. This additional step can be carried out by, for example, machining or the like.

Then, the step of preparing a stem mounted with the semiconductor laser element of FIG. 3 (S200) is carried out. Specifically, laser element 10 (refer to FIG. 2) is anchored at a predetermined position of element setting plane 18 in heat sink platform 5 (refer to FIG. 2) of stem 3 (refer to FIG. 2) prepared separately, and the electrode of laser element 10 is electrically connected to a lead end 8 (refer to FIG. 2) by tie line 9 formed of a conductor line or the like.

Then, the laser welding step of FIG. 3(S300) is conducted. Specifically, cap member 2 is set on reference plane 7 of stem 3 subjected to the mount of laser element 10 and arrangement of predetermined tie line 9. Cap member 2 is arranged so as to cover heat sink platform 5 of stem 3, and so that one of the two holes 16a and 16b at the sidewall of cap member 2 (specifically, hole 16b) overlaps with the outer circumferential sidewall of heat sink platform 5. Then, a laser beam is directed to hole 16b as indicated by arrow 25 with hole 16b located in an overlapping manner with the outer circumferential plane of heat sink platform 5. Thus, a portion of the outer circumferential plane of heat sink platform 5 and a portion of the sidewall of cap member 2 are laser-welded by allowing the portion of the inner wall of hole 16b (the sidewall of cap member 2 adjacent hole 16b) and the portion of the outer circumferential plane of heat sink platform 5 facing hole 16b to melt by a laser beam and then be hardened. As a result, connecting fixation is established between cap member 2 and stem 3.

Accordingly, it is no longer necessary to establish connection between cap member 2 and stem 3 through resistance welding, as in the conventional case. Therefore, formation of a projection (flange) in cap member 2 at the connecting region between cap member 2 and reference plane 7 of stem 3 is dispensable. This provides the advantage that the distance W1 (refer to FIG. 2) between the outermost edge of cap member 2 and the bottom of positioning groove 11c (refer to FIG. 2) located at the outer circumference of reference plane 7 (refer to FIG. 2) of stem 3 can be increased.

Thus, the semiconductor laser device of FIG. 1 can be obtained.

To summarize the characteristic feature of the fabrication method of the semiconductor laser device of the present invention, the fabrication method of a semiconductor laser device according to the present invention includes a step of preparing a stem on which a semiconductor laser element is mounted as the step of preparing a base member (S200), a step of preparing a cap member (S100), and a laser welding step as the step of laser welding the contacting region between the cap member and the element mount unit. At the step of preparing a stem (S200), a main unit 4 having a reference plane 7 and a heat sink platform 5 identified as an element mount unit located on reference plane 7 of main body 4 for mounting laser element 10 are prepared as a base member corresponding to stem 3.

Figure 9:
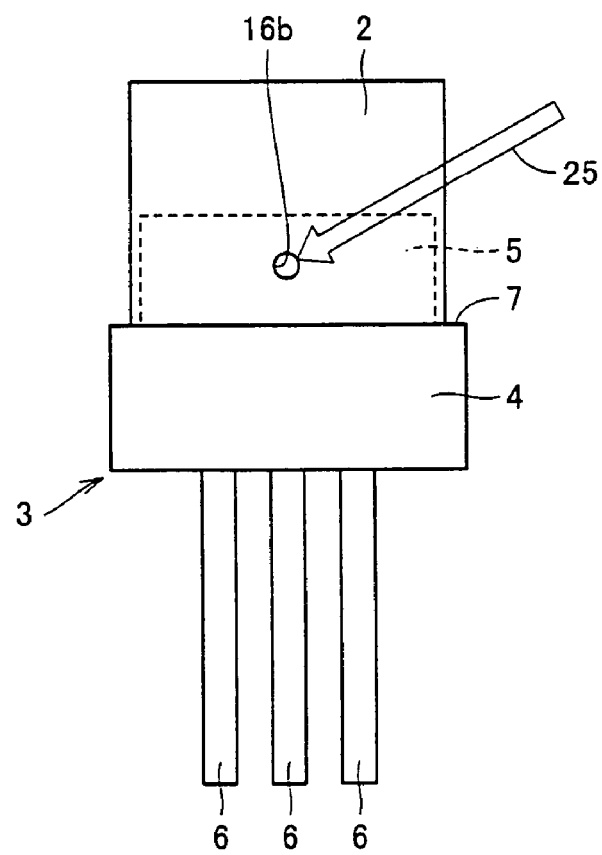
FIG. 9 is a schematic diagram to describe the laser welding step of FIG. 3.

At the step of preparing a cap member (S100), a cap member 2 that can cover heat sink platform 5 is prepared, formed with holes 16a and 16b at the sidewall facing outer circumferential plane 27 of heat sink platform 5. At the laser-welding step identified as the step of welding the contacting region (S300), cap member 2 is arranged so as to cover heat sink platform 5 on reference plane 7 of stem 3 as shown in FIG. 9, and so that the inner circumferential plane of the sidewall where holes 16a and 16b are formed form contact with outer circumferential plane 27 of heat sink platform 5. Under this state, the contacting region functional region) between cap member 2 and heat sink platform 5 is subjected to laser welding by directing a laser beam to the contacting region through hole 16b. Accordingly, semiconductor laser device 1 of the present invention can be fabricated readily.

Figure 7:
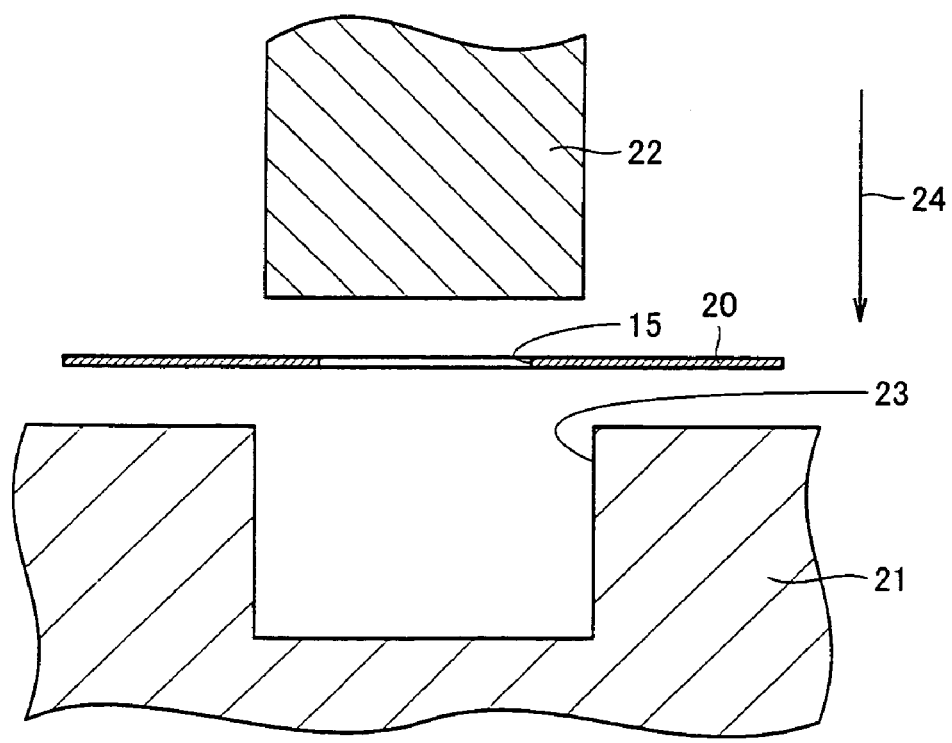
FIG. 7 is a schematic diagram to describe the press step of FIG. 4.

The fabrication method of a semiconductor laser device according to the present invention is directed to a fabrication method of semiconductor laser device 1, as shown in FIGS. 1 and 2. The fabrication step includes a material preparation step (S110) identified as the step of preparing material for the cap member, and a step of forming a hole in the material (S120), as shown in FIG. 4, and a press step (S130) identified as a step of shaping cap member 2 by press-working material 20 formed with holes 16a and 16b, as shown in FIG. 7. Cap member 2 constituting semiconductor laser device 1 can be readily obtained.

A modification of the semiconductor laser device of the first embodiment shown in FIGS. 1 and 2 will be described with reference to FIG. 10.

Figure 10:
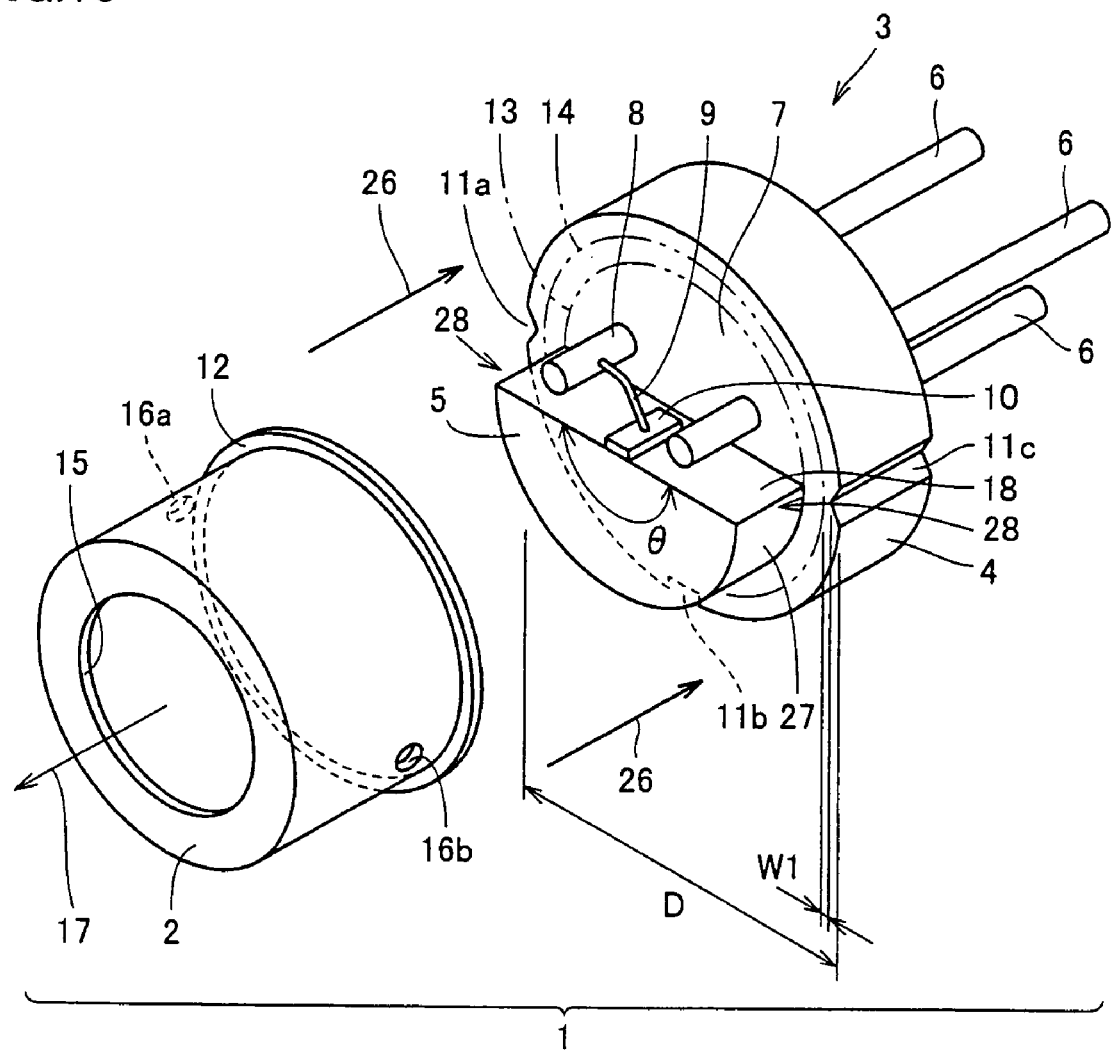
FIG. 10 is an exploded schematic view of a modification of the semiconductor laser device of FIGS. 1 and 2.

The semiconductor laser device of FIG. 10 has a structure basically similar to that of the semiconductor laser device of FIGS. 1 and 2, provided that the structure of the rim of cap member (the portion abutting against reference plane 7 of stem 3) differs. Specifically, the rim of cap member 2 has a projection 12 formed. Projection 12 of cap member 2 is fixedly attached to reference plane 7 of stem 3 by, for example, resistance welding.

To summarize the feature of semiconductor laser device 1 of the present modification, semiconductor laser device 1 is characterized in that the joint (cap weld portion 13) between projection 12 constituting the rim of cap member 2 facing reference plane 7 and reference plane 7 of main unit 4 is fixedly attached by resistance welding, in addition to the structure of the semiconductor laser device shown in FIGS. 1 and 2.

Since cap member 2 can be fixedly attached to stem 3 through resistance welding in addition to the fixation between the portion where hole 16b is formed (the portion of the sidewall of cap member 2) and the outer circumferential plane of heat sink platform 5, a more secure connection can be established between cap member 2 and stem 3. Cap member 2 can be fixedly attached to stem 3 by only one of the welding processes, i.e. either laser welding or resistance welding.

Second Embodiment

A semiconductor laser device according to a second embodiment of the present invention will be described with reference to FIGS. 11-13.

Figure 11:
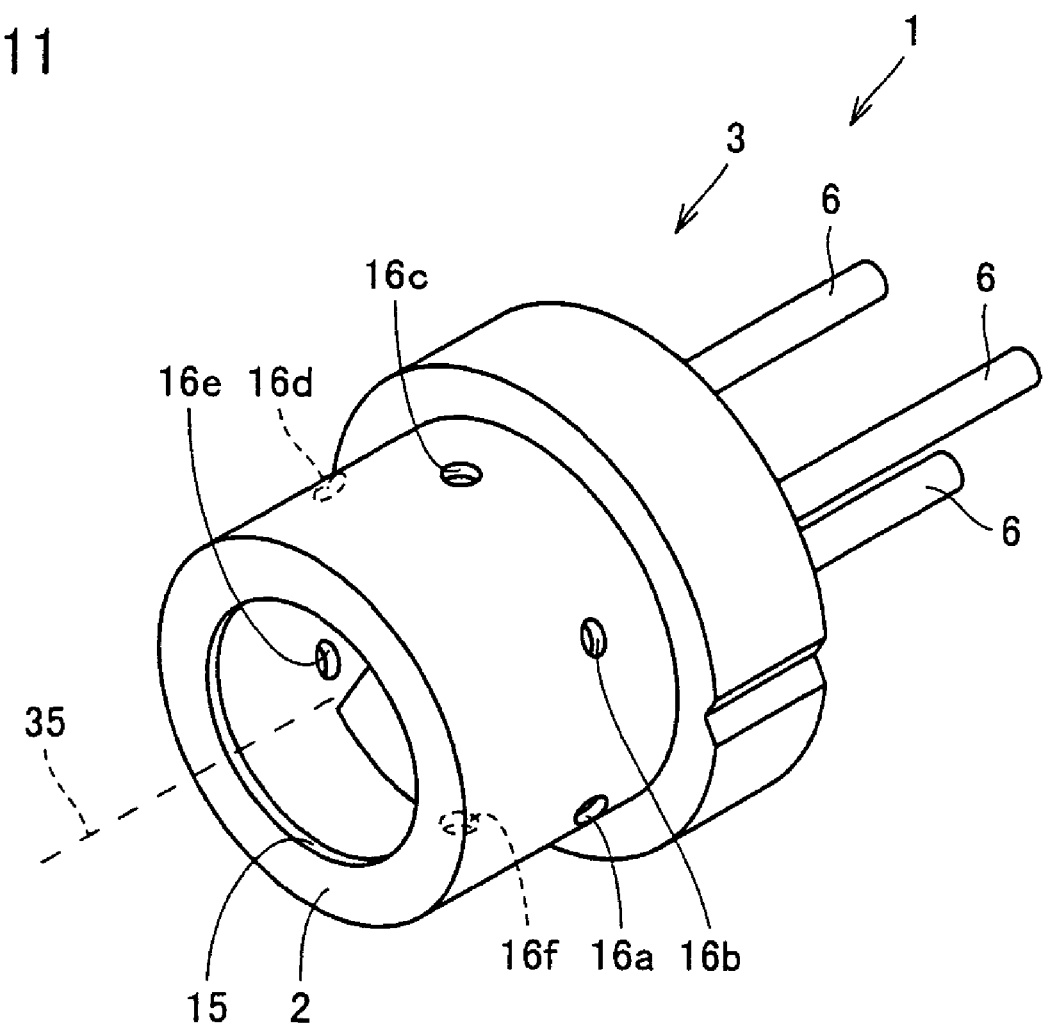
FIG. 11 is a perspective schematic view of a semiconductor laser device according to a second embodiment of the present invention.
Figure 12:
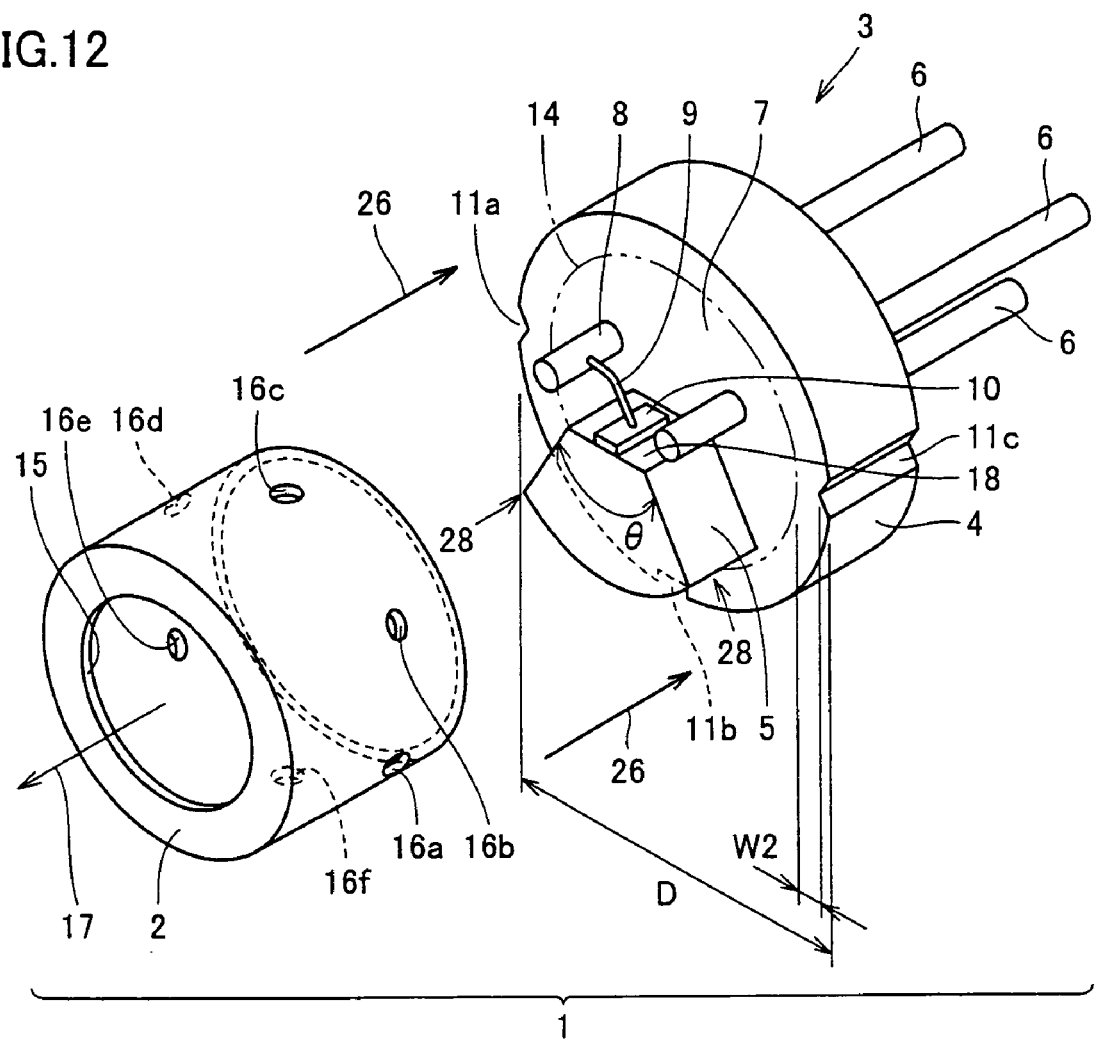
FIG. 12 is an exploded schematic view of the semiconductor laser device of FIG. 11.
Figure 13:
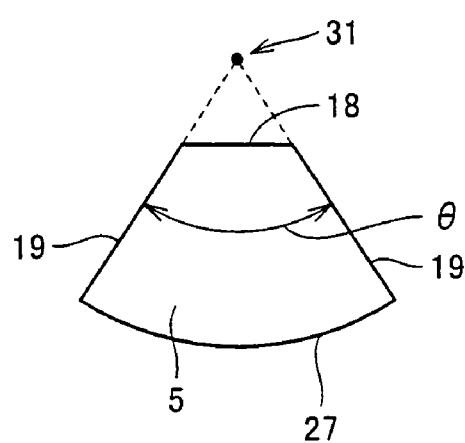
FIG. 13 is a schematic diagram to describe the configuration of the heat sink platform shown in FIG. 12.

Referring to FIGS. 11-13, semiconductor laser device 1 has a structure similar to that of the semiconductor laser device of FIGS. 1 and 2, provided that the number of holes 16a-16f formed at the sidewall of cap member 2, and the configuration of heat sink platform 5 differ (refer to FIG. 12). The semiconductor laser device of FIGS. 11-13 has six holes 16a-16f formed at cap member 2, as shown in. FIG. 12. These six holes 16a-16f are formed symmetrically with respect to the center axis 35 (cylindrical axis) of cap member 2, i.e., at equal intervals with respect to each other. Heat sink platform 5 has an open angle of 60°. This open angle θ of heat sink platform 5 refers to the angle formed by respective line segments extending along the two sidewalls 19 of heat sink platform 5 and intersecting at a point (virtual point 31), centered about virtual point 31 (the angle between 2 rays drawn from the vertex). Virtual point 31 is preferably the center point of reference plane 7 of stem 3. Virtual point 31 may be the center point of a circle including the arc formed by outer circumferential plane 27 of heat sink platform 5.

At the contacting region between the sidewall portion of capacitor member 2 where one of holes 16a-16f of cap member 2 is formed (for example the region adjacent hole 16a at the sidewall of cap member 2) and outer circumferential plane 27 of heat sink platform 5, a portion of the sidewall of cap member 2 melts and adheres to the outer circumferential plane of heat sink platform 5 by laser welding. Thus, cap member 2 is fixedly attached to stem 3.

When the open angle θ of heat sink platform 5 is 60°, holes 16a-16f at the sidewall of cap member 2 are formed at equal intervals with respect to each other with respect to center axis 35 (cylindrical axis) of cap member 2. Therefore, at least one of six holes 16a-16f will always be located overlapping with outer circumferential plane 27 of heat sink platform 5. Therefore, the step of fixing cap member 2 with respect to stem 3 (specifically, the laser welding step (S300) shown in FIG. 3) can be conducted without taking into account the rotation directivity (position of holes 16a-16f) of cap member 2.

Likewise the semiconductor laser device of FIGS. 1 and 2, it is not necessary to conduct resistance welding when cap member 2 is to be fixedly attached to stem 3. Therefore, formation of a projection and the like at the end portion of cap member 2 is dispensable. This provides the advantage that the distance W2 between the outermost edge of cap member 2, when attached to reference plane 7 of stem 3, and the bottom of positioning groove 11c can be set to a relatively large value of approximately 0.3 mm (i.e., the area of reference plane 7 in stem 3 located outer than the outermost edge of cap member 2 can be set relatively larger).

When this distance W2 is set to approximately 0.3 mm, this value of distance W2 is approximately equal to distance W2 in a semiconductor laser device that has a conventional diameter D of 5.6 mm for stem 3. Therefore, when semiconductor laser device 1 is to be incorporated into an optical disk drive apparatus (for example, incorporated into a pickup apparatus for an optical disk), the region between the outermost edge of cap member 2 and the outer circumference of reference plane 7 of stem 3 of semiconductor laser device 1 can be used as the reference plane for attaching semiconductor laser device 1. Therefore, adjustment of the rotation position of semiconductor laser device 1 can be conducted readily, as in a conventional semiconductor laser device that is relatively large in size (for example, a semiconductor laser device having a diameter D of approximately 5.6 mm).

To summarize, semiconductor laser device 1 is characterized in that, based on the structure of the semiconductor laser device of the first embodiment, the open angle θ formed by the respective end points (two ends 28) in the direction along reference plane 7, at outer circumferential plane 27 of heat sink platform 5 identified as the element mount unit facing the sidewall of cap member 2, with respect to virtual point 31 identified as the center point of reference plane 7 of main unit 4, can be set to at least 360°/n, where n is the number of holes 16a-16f formed at the sidewall of cap member 2. The diameter of holes 16a-16f may be set to at least 0.25 mm and not more than 1 mm, for example. Further, holes 16a-16f may be positioned to be located substantially at the middle (midpoint) of outer circumferential plane 27 of heat sink platform 5 in the direction substantially perpendicular to reference plane 7 of stem.

This provides the advantage that, when cap member 2 is arranged so as to cover heat sink platform 5, at least one of the n holes (hole 16a in semiconductor laser device 1 of FIGS. 11 and 12, or hole 16b in semiconductor laser device 1 of FIGS. 1 and 2) will always face outer circumferential plane 27 of heat sink platform 5. Therefore, cap member 2 can be attached to stem 3 without having to pay critical attention to the direction of rotation of cap member 2 about center axis 35.

Since at least one of the plurality of holes (hole 16a among six holes 16a-16f of the semiconductor laser device of FIG. 11, or hole 16b among two holes 16a and 16b of semiconductor laser device 1 of FIG. 1) is always located facing outer circumferential plane 27 of heat sink platform 5 (overlapping with outer circumferential plane 27), outer circumferential plane 27 of heat sink platform 5 can be fixedly attached to the sidewall in the vicinity of the area where hole 16a of cap member 2 (refer to FIG. 12), or hole 16b (refer to FIG. 2) is formed by laser welding readily.

The number of holes n is arbitrary. For example, the number n of holes 16a and 16b formed at the sidewall of cap member 2 may be 2 in semiconductor laser device 1 of FIGS. 1 and 2, and the open angle θ of heat sink platform 5 may be substantially 180°. Holes 16a and 16b are preferably arranged at equal intervals with respect to each other about center axis 35. This provides the advantage that production of cap member 2 is facilitated by virtue of the fewer number of holes to be formed at cap member 2, and that a hole in cap member 2 (one of holes 16a and 16b (hole 16b)) can be always made to face outer circumferential plane 27 of heat sink platform 5 when capacitor member 2 is set on heat sink platform 5.

As shown in FIGS. 11 and 12, the number n of holes 16a-16f formed at sidewall of cap member 2 may be 6 in semiconductor laser device 1 of FIGS. 11 and 12, and the open angle θ of heat sink platform 5 may be substantially 60°. Further, the open angle θ of heat sink platform 5 may be 60° or more.

By setting the open angle θ of heat sink platform 5 to approximately 60°, a structure of stem 3 (for example, lead end 8 electrically connected to laser element 10) can be disposed beside laser element 10 located on heat sink platform 5. The six holes 16a-16f formed at cap member 2 are preferably formed at equal intervals with respect to each other about center axis 35 of cap member 2. This provides the advantage that, when cap member 2 is set on heat sink platform 5, at least one of the plurality of holes 16a-16f (hole 16a) of cap member 2 can be reliably located facing outer circumferential plane 27 of heat sink platform 5. Therefore, cap member 2 can be readily attached fixedly to heat sink platform 5 through laser welding and the like through the portion where hole 16a is formed.

The number of holes n may be 3-5, or 7 or more (integer). The formed holes are preferably located at equal intervals with respect to each other about center axis 35 of cap member 2. It is to be noted that when there are a relatively large number of holes n, the position of the hole may be deviated slightly from the position at equal intervals with respect to each other when viewed from center axis 35. In this case, the angle formed by two rays from two adjacent holes, among the plurality of holes (for example, holes 16a-16f) formed about center axis 35, is preferably set smaller than open angle θ of heat sink platform 5.

In semiconductor laser device 1, cap member 2 has a configuration of a cylinder. Cap member 2 may be set on reference plane 7 of stem 3 so that center axis 35 along the extending direction of cap member 2 (or center axis 35 of cap member 2 along the direction of attaching cap member 2 to stem 3 (the direction of arrow 26)) is approximately parallel to the direction substantially perpendicular to reference plane 7 of main unit 4 of stem 3. By rotating cylindrical cap member 2 about center axis 35, hole 16a (refer to FIG. 12) or hole 16b (refer to FIG. 2) at the sidewall of cap member 2 can be readily disposed at a position facing outer circumferential plane 27 of heat sink platform 5 of stem 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fabrication method of a semiconductor laser device comprising the steps of:

preparing a base member including a main unit having a reference plane, and an element mount unit located on the reference plane of said main unit for mounting a laser element, preparing a cap member that can cover said element mount unit, and that has a hole formed at a sidewall facing an outer circumferential plane of said element mount unit, and directing a laser beam towards a contacting portion between said cap member and said element mount unit through said hole to laser-weld said contacting portion under a state where said cap member is arranged so as to cover said element mount unit on the reference plane of said base member, and such that an inner circumferential plane of the sidewall where said hole is formed is in contact with the outer circumferential plane of said element mount unit.

* * * * *